United States Patent
Aderhold et al.

(10) Patent No.: US 9,640,412 B2
(45) Date of Patent: May 2, 2017

(54) APPARATUS AND METHOD FOR ENHANCING THE COOL DOWN OF RADIATIVELY HEATED SUBSTRATES

(75) Inventors: Wolfgang Aderhold, Cupertino, CA (US); Joseph M. Ranish, San Jose, CA (US); Blake R. Koelmel, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 2082 days.

(21) Appl. No.: 12/622,736

(22) Filed: Nov. 20, 2009

(65) Prior Publication Data

US 2011/0123178 A1 May 26, 2011

(51) Int. Cl.
*A21B 2/00* (2006.01)
*H01L 21/324* (2006.01)
*H01L 21/67* (2006.01)

(52) U.S. Cl.
CPC ...... *H01L 21/324* (2013.01); *H01L 21/67109* (2013.01); *H01L 21/67115* (2013.01)

(58) Field of Classification Search
None
See application file for complete search history.

(56) References Cited

U.S. PATENT DOCUMENTS

| | | | |
|---|---|---|---|
| 5,870,526 A | 2/1999 | Aschner et al. | |
| 5,965,047 A | 10/1999 | Blersch et al. | |
| 6,072,163 A * | 6/2000 | Armstrong et al. | 219/497 |
| 6,108,937 A | 8/2000 | Raaijmakers | |
| 6,808,758 B1 * | 10/2004 | Thakur | 427/559 |
| 6,809,035 B2 | 10/2004 | Yoo | |
| 6,926,933 B2 * | 8/2005 | Miyano et al. | 427/572 |
| 6,965,092 B2 * | 11/2005 | Mahawili | 219/390 |
| 7,029,505 B2 | 4/2006 | Sha et al. | |
| 7,135,656 B2 * | 11/2006 | Timans | 219/390 |
| 7,151,060 B2 * | 12/2006 | Roters et al. | 438/795 |
| 7,226,488 B2 * | 6/2007 | Gat | 29/25.01 |
| 7,358,462 B2 * | 4/2008 | Timans | 219/390 |
| 7,453,051 B2 * | 11/2008 | Timans | 219/390 |
| 7,745,762 B2 | 6/2010 | Timans et al. | |

(Continued)

FOREIGN PATENT DOCUMENTS

| | | |
|---|---|---|
| JP | H07-254545 | 10/1995 |
| JP | 2002-217183 | 8/2002 |

(Continued)

OTHER PUBLICATIONS

Niess, J. et al., "Pattern Effects During Spike Annealing of Ultra-Shallow Implants", *Electrochemical Society Proceedings* vol. 2003-14, (2003), 6 pgs.

(Continued)

*Primary Examiner* — Thor Campbell
(74) *Attorney, Agent, or Firm* — Servilla Whitney LLC (57) ABSTRACT

The present invention generally relates to methods and apparatus for processing substrates. Embodiments of the invention include apparatuses for processing a substrate comprising a dynamic heat sink that is substantially transparent to light from a radiant heat source, the dynamic heat sink being positioned near the substrate so the two are coupled. Additional embodiments of the invention are directed to methods of processing a substrate using the apparatuses described.

12 Claims, 4 Drawing Sheets

(56) References Cited

U.S. PATENT DOCUMENTS

| | | |
|---|---|---|
| 2002/0136831 A1 | 9/2002 | Gronet et al. |
| 2004/0185680 A1 | 9/2004 | Hauf et al. |
| 2006/0115968 A1 | 6/2006 | Funk |
| 2008/0142497 A1 | 6/2008 | Sorabji et al. |

FOREIGN PATENT DOCUMENTS

| | | |
|---|---|---|
| JP | 2002-525848 | 8/2002 |
| JP | 2002-252180 A | 9/2002 |
| JP | 2002530883 A | 9/2002 |
| JP | 2005-535129 | 11/2005 |
| JP | 2007-242850 | 9/2007 |
| JP | 2008-546203 | 12/2008 |
| WO | 2006/130573 A2 | 12/2006 |

OTHER PUBLICATIONS

PCT International Search Report & Written Opinion in PCT/US2010/057178, mailed Jun. 30, 2011, 14 pgs.

\* cited by examiner

APPARATUS AND METHOD FOR ENHANCING THE COOL DOWN OF RADIATIVELY HEATED SUBSTRATES

BACKGROUND

Field of the Invention

Embodiments of the present invention relate generally to the field of semiconductor processing. More specifically, embodiments of the invention are directed to methods and apparatus for enhancing the cooling of substrates which have been heated through radiative processes.

Background of the Related Art

A number of applications involve thermal processing of semiconductor and other materials, which require precise measurement and control of the temperature of the material. For instance, processing of a semiconductor substrate requires precise measurement and control of the temperature over a wide range of temperatures. One example of such processing is rapid thermal processing (RTP), which is used for a number of fabrication processes, including rapid thermal annealing (RTA), rapid thermal cleaning (RTC), rapid thermal chemical vapor deposition (RTCVD), rapid thermal oxidation (RTO), and rapid thermal nitridation (RTN). In the particular application of CMOS gate dielectric formation by RTO or RTN, thickness, growth temperature, and uniformity of the gate dielectrics are parameters that influence the overall device performance and fabrication yield. Some of these processes require variations in temperature across the substrate of less than a few degrees Celsius.

According to the International Technology Roadmap for Semiconductors, transistor SDE junction depths of 11 nm are required for the next nodes. Rapid Thermal Processing Spike Anneal is reaching a limitation as the time at temperature is limited to around one second with current technology. The millisecond anneal is a potential solution, but is difficult to integrate unless in combination with some RTP. As an immediate solution, RTP could be extended if the time at temperature could be reduced further.

It is desirable for temperatures to be as uniform as practicable in a substrate during thermal processing of the substrate. Additionally, it is desirable to decrease the amount of time required to cool the substrate after certain processes, e.g. spike anneal, are completed. In practice, the edge region of a substrate is thermally affected by the periphery of the RTP chamber more than are other regions of the substrate, leading to chronic temperature non-uniformities residing in the edge region. Standard control algorithms are designed to respond to radial temperature non-uniformities once detected. For very short processes, such as spike anneal processes, the control algorithm may not be able to compensate quickly enough, resulting in temperature non-uniformities near the edge of the substrate. Further, because the current design of RTP chambers is geared toward radial temperature non-uniformity on a circular substrate, this method of temperature control is unable to correct non-radial temperature non-uniformities, for example a "cold spot" that is not symmetrically centered on the substrate.

Thus, there is still a need for methods and apparatus for controlling the rapid thermal processing of a substrate that may be used for a wide range of substrates that enhance the cooling rate of substrates.

SUMMARY

Accordingly, one or more embodiments of the invention are directed to apparatuses for processing a substrate having a front side and a back side. The apparatuses comprise a process area within a chamber defined on one side by a window adjacent a radiant heat source located outside the process area. A dynamic heat sink is positioned in the process area and is substantially transparent to light from the radiant heat source. A substrate support is in the process area to hold the substrate adjacent the dynamic heat sink during thermal processing. The substrate support hold the substrate in a position such that at least one of the front side and the back side of the substrate faces the radiant heat source and so that the dynamic heat sink couples to the substrate to absorb heat from the substrate.

In detailed embodiments, the dynamic heat sink is a semitransparent plate that is substantially transparent to radiation from the radiant heat source and having a preselected heat absorption that conductively couples to the substrate to absorb heat, the semitransparent plate being positioned during thermal processing at a gap distance from the substrate such that the semitransparent plate remains cooler than the substrate during heating of the substrate.

In detailed embodiments, during thermal processing of a substrate there is a gap between the dynamic heat sink and the substrate. In specific embodiments, the gap is up to about 1 mm wide. Detailed embodiments of the invention further comprise a conductive fluid source in fluid communication with the gap such that the gap can be filled with a conductive fluid or displace/mix with an existing fluid and be held substantially static. In specific embodiments, the fluid is selected from the group consisting of nitrogen gas, oxygen gas, helium gas, argon gas, hydrogen gas and combinations thereof.

According to some embodiments of the invention, during thermal processing the dynamic heat sink is positioned adjacent the substrate on the side opposite the radiant heat source.

In some embodiments of the invention, during thermal processing the dynamic heat sink is positioned adjacent the substrate on the same side as the radiant heat source between the radiant heat source and the substrate.

In detailed embodiments, the dynamic heat sink is supported by the substrate support.

According to some detailed embodiments, the dynamic heat sink is supported by an independent heat sink support and the independent heat sink support and substrate support are separately moveable. In specific embodiments, during thermal processing of a substrate, the independent heat sink support is operable to move the dynamic heat sink so that there is a gap that can be varied between the dynamic heat sink and the substrate.

In some embodiments, the apparatus further comprises a reflector plate to reflect light from the radiant heat source, the reflector plate being positioned so that one of the front side and the back side face the radiant heat source and the other of the front side and the back side face the reflector plate.

In detailed embodiments, the dynamic heat sink is selected from the group consisting of quartz, sapphire and transparent YAG.

Additional embodiments of the invention are directed to apparatuses for processing a substrate having a front side and a back side. The apparatuses comprise a process area within a chamber defined on one side by a window adjacent a radiant heat source located outside the process area. A substrate support assembly is within the process area to hold the substrate during thermal processing in a position such that at least one of the front side and back side of the substrate faces the radiant heat source. A semitransparent plate that is substantially transparent to radiation from the radiant heat source and having a preselected heat absorption that conductively couples to the substrate to absorb heat is in the process area. The semitransparent plate being positioned during thermal processing at a gap distance from the substrate such that the semitransparent plate remains cooler than the substrate during heating of the substrate.

In detailed embodiments, the semitransparent plate is made from a material that has a heat absorption that is less than the heat absorption of the substrate material.

In one or more embodiments, the gap distance is adjustable such that the heat absorption of the semitransparent plate is dynamic.

In specific embodiments, the substrate is silicon and the semitransparent plate comprises quartz.

According to some embodiments, the apparatuses further comprise a conductive fluid source in fluid communication with the gap such that the gap can be filled with a conductive fluid or displace/mix with an existing fluid and be held substantially static.

Further embodiments of the invention are directed to methods of processing a substrate having a front side and a back side in a chamber comprising a radiant heat source. A substrate is supported within a process area of the chamber, the process area defined on one side by a lamp separating the radiant heat source from the process area. A dynamic heat sink is supported within the process area, the dynamic heat sink being substantially transparent to light emitted by the radiant heat source. The radiant heat source is operated to heat the substrate to a first temperature. The radiant heat source is deactivated, and the dynamic heat sink is positioned such that it absorbs heat from the substrate.

In detailed embodiments, the dynamic heat sink is positioned adjacent the substrate on the opposite side from the radiant heat source.

In some detailed embodiments, the dynamic heat sink is positioned adjacent the substrate and on the same side as the radiant heat source.

According to one or more embodiments, there is a gap between the dynamic heat sink and the substrate. In specific embodiments, the methods further comprise adding a fluid to the gap between the dynamic heat sink and the substrate.

In detailed embodiments, the dynamic heat sink is moved to a position closer to the substrate upon deactivating the radiant heat source.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

As noted above, it is desirable to have temperature uniformity in a substrate during thermal processing of the substrate. Temperature uniformity provides uniform process variables on the substrate (e.g. layer thickness, resistivity, etch depth) for temperature activated steps such as film deposition, oxide growth and etching. In addition, temperature uniformity in the substrate is necessary to prevent thermal stress-induced substrate damage such as warpage, defect generation and slip. For example, at 1150° C., a center to edge temperature difference on a four-inch silicon wafer of approximately 5° C. can induce dislocation formation and slip.

Temperature gradients may also be induced by other sources. For example, a substrate may have non-uniform emissivity because of spatial modifications to surface areas or volumes of the substrate. These modifications may include films that have been patterned by photolithography or locally doped regions, such as buried layers for bipolar transistors. In addition, substrate temperature gradients may be induced by localized gas cooling or heating effects related to processing chamber design as well as non-uniform endothermic or exothermic reactions that may occur on the substrate surface during processing.

Figure 1:
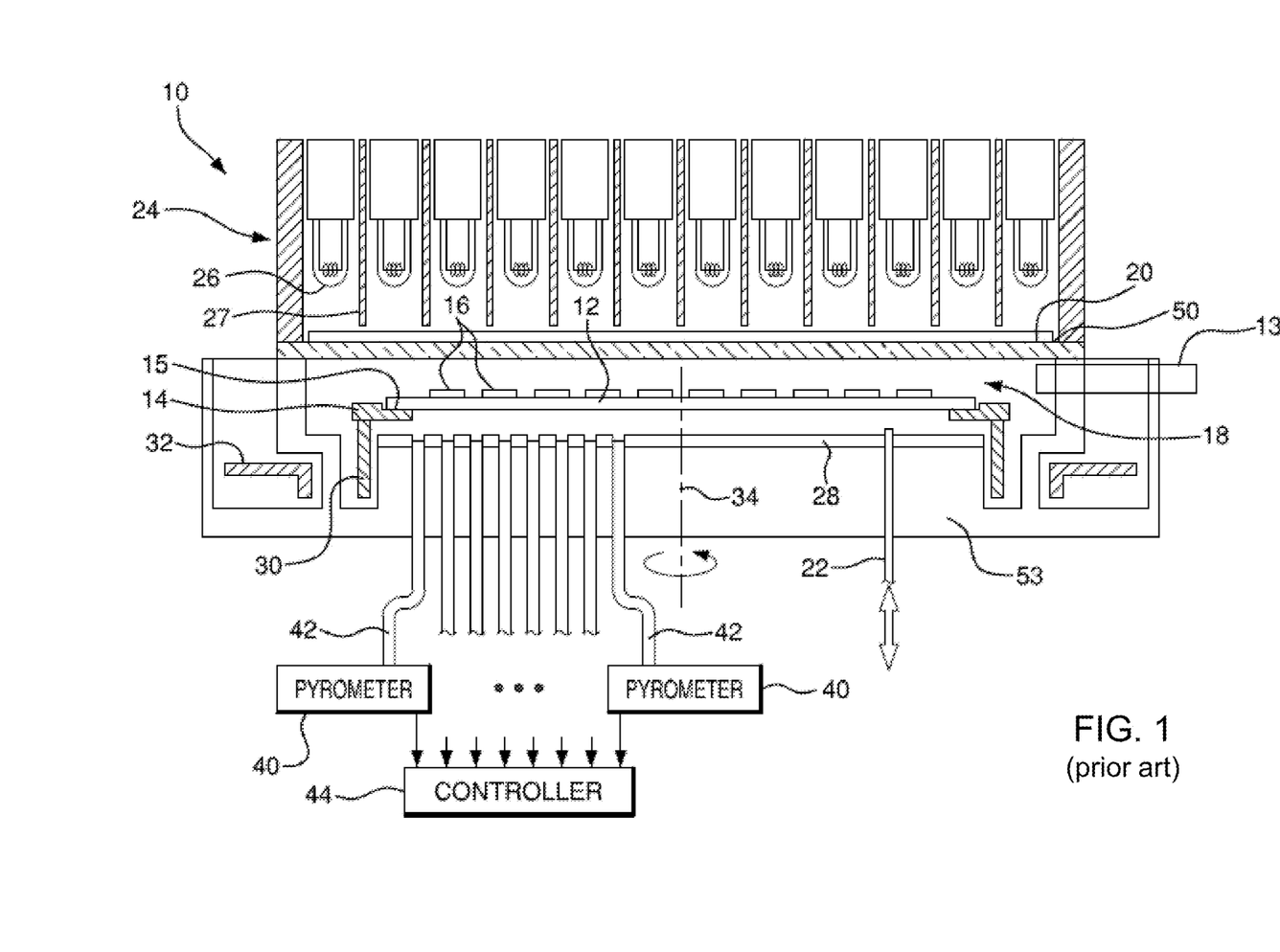
FIG. 1 illustrates a conventional rapid thermal processing chamber.

FIG. 1 schematically represents a conventional rapid thermal processing chamber 10. Peuse et al. describe further details of this type of reactor and its instrumentation in U.S. Pat. Nos. 5,848,842 and 6,179,466. A substrate or wafer 12, for example, a semiconductor wafer such as a silicon wafer to be thermally processed is passed through the valve or access port 13 into the process area 18 of the chamber 10. The wafer 12 is supported on its periphery by a substrate support shown in this embodiment as an annular edge ring 14 having an annular sloping shelf 15 contacting the corner of the wafer 12. Ballance et al. more completely describe the edge ring and its support function in U.S. Pat. No. 6,395,363. The wafer is oriented such that processed features 16 already formed in a front surface of the wafer 12 face upwardly, referenced to the downward gravitational field, toward a process area 18 defined on its upper side by a transparent quartz window 20. The transparent quartz window 20 is located a substantial distance from the wafer 12 such that window has minimal effect on cooling of the substrate during processing. Typically, the distance between the wafer 12 and the window 20 is on the order of 20 mm. Contrary to the schematic illustration, the features 16 for the most part do not project substantial distances beyond the surface of the wafer 12 but constitute patterning within and near the plane of the surface. Three lift pins 22 may be raised and lowered to support the back side of the wafer 12 when the wafer is handed between a paddle or robot blade (not shown) bringing the wafer into the chamber and onto the edge ring 14. A radiant heating apparatus 24 is positioned above the window 20 to direct radiant energy toward the wafer 12 and thus to heat it. In the reactor or processing chamber 10, the radiant heating apparatus includes a large number, 409 being an exemplary number, of high-intensity tungsten-halogen lamps 26 positioned in respective reflective tubes 27 arranged in a hexagonal close-packed array above the window 20. The array of lamps 26 is sometimes referred to as the lamphead. However, other radiant heating apparatus may be substituted. Generally, these involve resistive heating to quickly ramp up the temperature of the radiant source. Examples of suitable lamps include mercury vapor lamps having an envelope of glass or silica surrounding a filament and flash lamps which comprise an envelope of glass or silica surrounding a gas such as xenon, which provides a heat source when the gas is energized. As used herein, the term lamp is intended to cover lamps including an envelope that surrounds a heat source. The "heat source" of a lamp refers to a material or element that can increase the temperature of the substrate, for example, a filament or gas that can be energized.

As used herein, rapid thermal processing or RTP refers an apparatus or a process capable of uniformly heating a wafer at rates of about 50° C./second and higher, for example, at rates of 100° to 150° C./second, and 200° to 400° C./second. Typical ramp-down (cooling) rates in RTP chambers are in the range of 80-150° C./second. Some processes performed in RTP chambers require variations in temperature across the substrate of less than a few degrees Celsius. Thus, an RTP chamber must include a lamp or other suitable heating system and heating system control capable of heating at rate of up to 100° to 150° C./second, and 200° to 400° C./second distinguishing rapid thermal processing chambers from other types of thermal chambers that do not have a heating system and heating control system capable of rapidly heating at these rates.

In accordance with a further aspect of the present invention embodiments of the present invention may be applied also to flash annealing. As used herein flash annealing refers to annealing a sample in less than 5 seconds, specifically, less than 1 second, and in some embodiments, milliseconds.

It is important to control the temperature across the wafer 12 to a closely defined temperature uniform across the wafer 12. One passive means of improving the uniformity includes a reflector 28 extending parallel to and over an area greater than the wafer 12 and facing the back side of the wafer 12. The reflector 28 efficiently reflects heat radiation emitted from the wafer 12 back toward the wafer 12. The spacing between the wafer 12 and the reflector 28 can be within the range of 3 to 9 mm, and the aspect ratio of the width to the thickness of the cavity is advantageously greater than 20. The reflector 28, which may be formed of a gold coating or multi-layer dielectric interference mirror, effectively forms a black-body cavity at the back of the wafer 12 that tends to distribute heat from warmer portions of the wafer 12 to cooler portions. In other embodiments, for example, as disclosed in U.S. Pat. Nos. 6,839,507 and 7,041,931, the reflector 28 may have a more irregular surface or have a black or other colored surface. The reflector 28 can be deposited on a water-cooled base 53 made of metal to heat sink excess radiation from the wafer, especially during cool down. Accordingly, the process area 18 of the processing chamber has at least two substantially parallel walls, of which a first is a window 20, made of a material being transparent to radiation such as quartz, and a second wall/base 53 substantially parallel to the first wall which is made of metal and is significantly not transparent.

One way of improving the uniformity includes supporting the edge ring 14 on a rotatable cylinder 30 that is magnetically coupled to a rotatable flange 32 positioned outside the chamber. A rotor (not shown) rotates the flange 32 and hence rotates the wafer about its center 34, which is also the centerline of the generally symmetric chamber.

Another way of improving the uniformity divides the lamps 26 into zones arranged generally ring-like about the central axis 34. Control circuitry varies the voltage delivered to the lamps 26 in the different zones to thereby tailor the radial distribution of radiant energy. Dynamic control of the zoned heating is affected by, one or a plurality of pyrometers 40 coupled through one or more optical light pipes 42 positioned to face the back side of the wafer 12 through apertures in the reflector 28 to measure the temperature across a radius of the rotating wafer 12. The light pipes 42 may be formed of various structures including sapphire, metal, and silica fiber. A computerized controller 44 receives the outputs of the pyrometers 40 and accordingly controls the voltages supplied to the different rings of lamps 26 to thereby dynamically control the radiant heating intensity and pattern during the processing. Pyrometers generally measure light intensity in a narrow wavelength bandwidth of, for example, 40 nm in a range between about 700 to 1000 nm. The controller 44 or other instrumentation converts the light intensity to a temperature through the well known Planck distribution of the spectral distribution of light intensity radiating from a black-body held at that temperature.

The chamber shown in FIG. 1 allows the wafer 12 support to be easily levitated at different vertical positions inside the chamber to permit control of the substrate's thermal exposure. It will be understood that the configuration shown in FIG. 1 is not intended to be limiting. In particular, the invention is not limited to configurations in which the heat source or lamps are directed at one side or surface of the substrate and the pyrometers are directed at the opposite side of the wafer.

As noted above, wafer temperature in the process area of a processing chamber is commonly measured by radiation pyrometry. While radiation pyrometry can be highly accurate, radiation which is within the radiation pyrometer bandwidth and which originates from the heating source may interfere with the interpretation of the pyrometer signal if this radiation is detected by the pyrometer. In Applied Materials' RTP systems this minimized by the process kit and by the wafer itself. The process kit couples the wafer with the rotation system. It may include a support cylinder which is shown as 30 in FIG. 1. It may also include a support ring which is not shown in the Figures but it may be used in certain processing chamber configurations). Such a support ring is basically an auxiliary edge ring which supports the edge ring, which is shown as 14 in FIG. 1.

In addition to minimizing temperature non-uniformity between all regions of a substrate during rapid thermal processing, it is also important that the actual time-temperature trajectory of a substrate varies as little as possible from the desired time-temperature trajectory of the substrate, particularly from the peak temperature. Time-temperature trajectory and peak temperature are described below in conjunction with FIG. 2.

Figure 2:
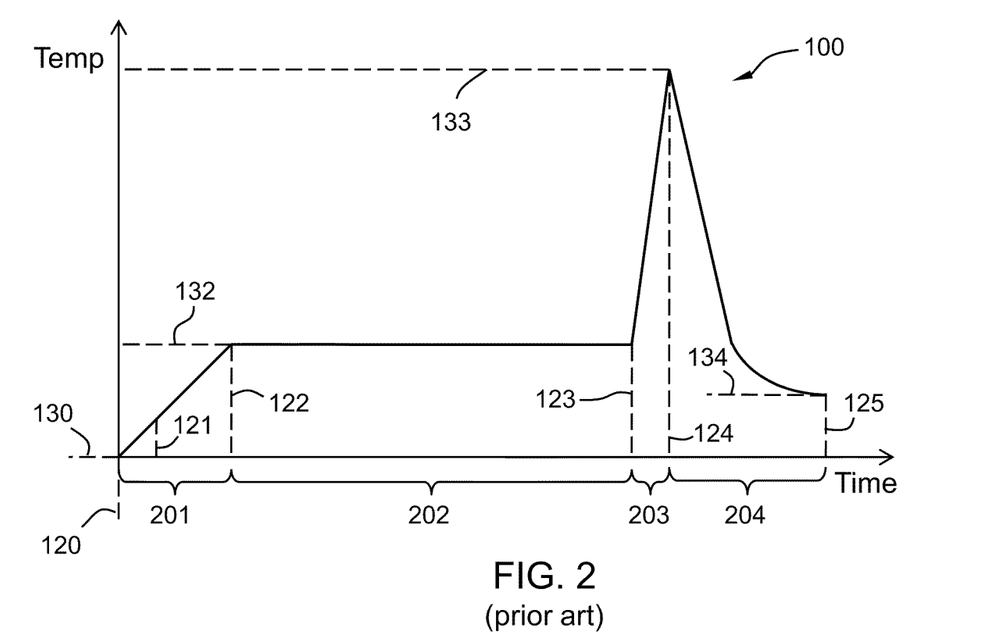
FIG. 2 illustrates an ideal time-temperature trajectory for an exemplary rapid thermal process.

Accordingly, one or more embodiments of the invention are helpful in achieving an ideal time-temperature trajectory in RTP processes. FIG. 2 illustrates an ideal time-temperature trajectory, hereinafter referred to as target time-temperature trajectory 100 for an exemplary rapid thermal process, in this case a spike anneal process. The abscissa represents time, the ordinate represents substrate temperature, and target time-temperature trajectory 100 represents the desired temperature of a substrate at any time during the spike anneal process. At time 120, thermal processing of the substrate begins with the substrate at temperature 130, which is substantially room temperature. The substrate temperature is increased to temperature 132 during initial temperature ramp 201, described below in conjunction with FIG. 3. The substrate temperature is increased using high-intensity lamps. Starting at time 122, the substrate temperature is held constant at temperature 132 for the duration of stabilization period 202. At time 123 the substrate temperature is quickly increased to peak temperature 133 at time 124 and then immediately reduced to temperature 134 at time 125. If peak temperature 133 of a substrate is not met during RTP, important processes on the substrate may not be completed, such as post-implant anneal. If peak temperature 133 is exceeded during RTP, the process may be detrimentally affected in other ways, for example from unwanted diffusion of implanted atoms into the substrate or by exceeding the thermal budget of devices formed on the substrate.

Figure 3:
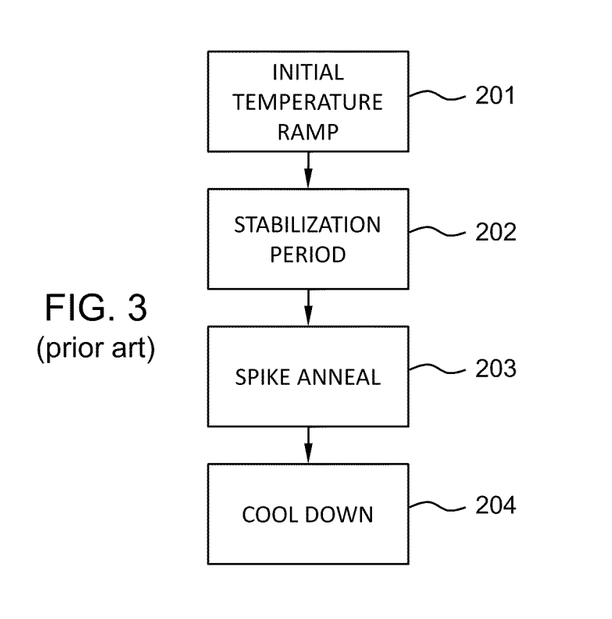
FIG. 3 is a flow chart illustrating a typical process sequence for a rapid thermal process.

FIG. 3 is a flow chart illustrating a typical process sequence 200 for a rapid thermal process, such as the spike anneal process described above in conjunction with FIG. 2. Generally, such a process begins with an initial temperature ramp 201 of the substrate. Until the substrate is at a temperature of about 300° C. to about 400° C., open-loop heating is performed during the first segment of initial temperature ramp 201. Referring back to FIG. 2, open-loop heating takes place between time 120 and 121. During open-loop heating, no substrate temperature feedback is incorporated into controlling the process and instead lamp power is applied to the substrate at pre-determined values for a pre-determined duration in order to heat the substrate to a temperature regime in which the substrate will be substantially opaque to the majority of lamp energy being applied to it. Below about 300° C., a typical RTP substrate, such as a silicon wafer, is largely transparent to much of the radiant energy produced by typical heating lamps. When this is the case, radiant energy that passes through the substrate may then be detected by the pyrometers that measure substrate backside temperature, producing an inaccurate substrate temperature measurement. For a closed-loop heating control algorithm, inaccurate substrate temperature measurement may result in serious control problems during the initial temperature ramp 201, such as instability and/or hunting. Open-loop heating is typically used at the beginning of RTP to avoid this problem. The set points for open-loop heating are generally determined empirically.

After the substrate is heated to between about 300° C. to about 400° C., the initial temperature ramp 201 is then generally completed using a closed-loop control algorithm to bring the substrate temperature to a stabilization temperature of about 500° C. to about 700° C. Closed-loop control incorporates temperature measurement of the substrate at a given time step in the thermal process in one or more pyrometer zones into the control algorithm in order to fine-tune the power-output of the heating lamps for the subsequent time step. Time steps may be relatively small, for example, 0.1 or 0.01 seconds. The minimum time step size is generally limited by the sampling rate of the temperature sensors used to control the heating process. The use of closed-loop control minimizes error between desired and actual substrate temperatures.

Once the substrate reaches stabilization temperature at the end of initial temperature ramp 201, a stabilization period 202 generally takes place after. The stabilization period 202 is intended to eliminate thermal gradients that have been imprinted on the substrate during the initial temperature ramp 201 by allowing the substrate to equilibrate prior to beginning spike anneal 203, which is the temperature sensitive segment of the thermal process. Non-uniformities in substrate temperature that are present at the beginning of spike anneal 203 are unlikely to be corrected during the process. The stabilization period 202 is between about 5 seconds and about 30 seconds in length, typically between about 10 seconds and about 20 seconds. The substrate temperature is controlled to remain at the stabilization temperature 132, as illustrated in FIG. 2, which may be between about 500° C. to about 700° C., depending on the particular thermal process.

Upon completion of the stabilization period 202, spike anneal 203 then begins. In this example, spike anneal 203 is the segment of the process in which the thermal processing of the substrate actually takes place. A particular application of the spike anneal process is to perform the anneal on a substrate after boron implant. In this case, spike anneal 203 relocates the implanted boron from random locations in the crystal to electrically active sites in the silicon lattice while minimizing the thermal exposure of the substrate. As illustrated in FIG. 2, spike anneal 203 takes place between times 123 and 124 and is followed by a cool-down 204. Ramp rates of the substrate temperature during spike anneal 203 are generally between about 150° C./s and about 300° C./s and peak temperature 133 is about 1000° C. to about 1200° C./s, meaning that spike anneal 203 generally only last a few seconds. Hence, there is little time for a control algorithm to correct variation in substrate temperature from the target time-temperature trajectory 100 during the most temperature sensitive segment of the thermal process. Any variation that occurs in substrate temperature from the target temperature during this segment of the rapid thermal process, e.g. overshoot, undershoot or widespike, will reduce the peak temperature repeatability between substrates. Referring back to FIG. 3, spike anneal 203 is then followed by cool-down 204, ending the rapid thermal processing of the substrate.

Figure 4:
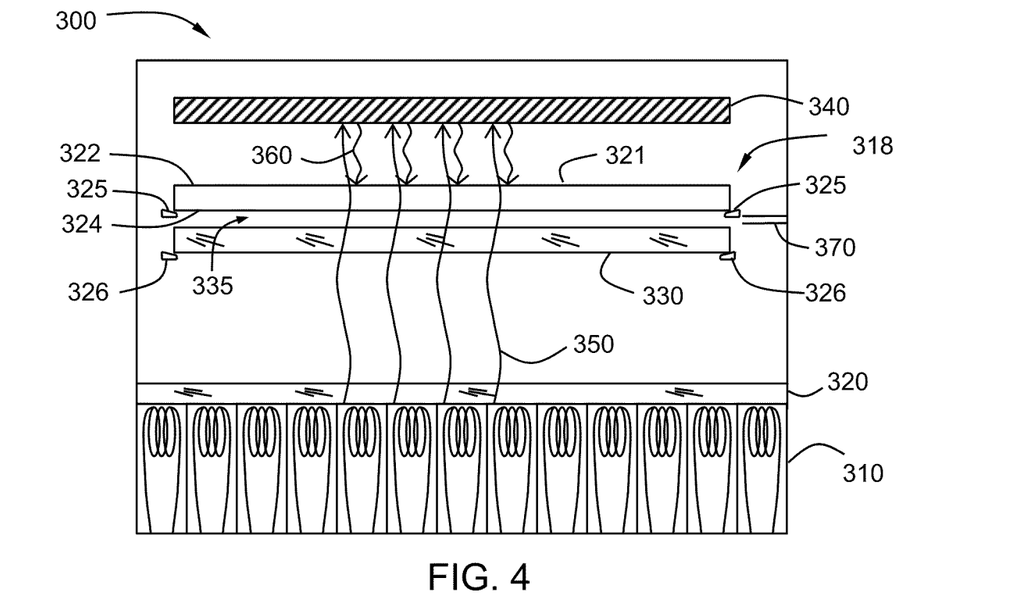
FIG. 4 illustrates a processing apparatus according to one or more embodiments of the invention.
Figure 5:
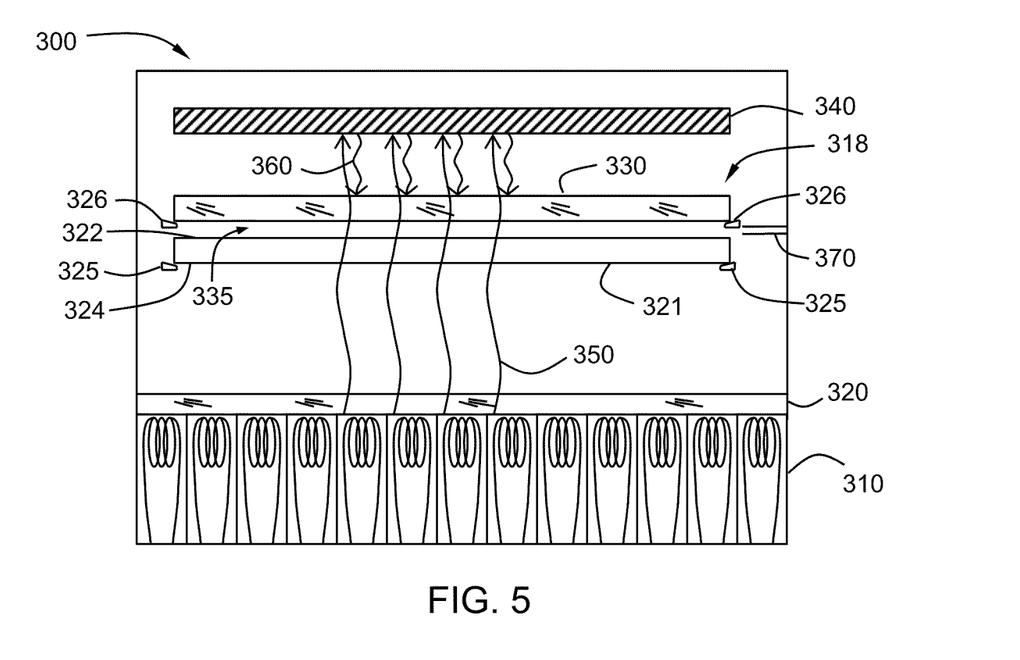
FIG. 5 illustrates a processing apparatus according to one or more embodiments of the invention.

FIGS. 4 and 5 show exemplary embodiments of modifications to the substrate processing apparatus shown in FIG. 1. FIG. 4 shows a representation of a processing chamber 300, as might be used for rapid thermal processing type processes, including, but not limited to, rapid thermal annealing. A substrate 321 having a front side 322 and a back side 324 is supported within a process area 318 of the chamber 300 defined on one side by window 320. The chamber 300 includes a radiant heat source 310 separated from the process area 318 by the window 320, which can be a quartz window that is substantially transparent to radiation generated by the heat source 310. It will be appreciated that the window 320 is positioned at a distance such that it has minimal effect on cooling of a substrate during processing, and is typically on the order of at least about 15 to 20 mm from the substrate. The configuration of the radiant heat source 310 can vary depending on the desired heating characteristics, but in a specific embodiment, the radiant heat source 310 comprises a plurality of high intensity lamps arranged in a hexagonal configuration. The lamps can be resistive heating lamps including a metal heating elements such as a tungsten used in tungsten halogen lamps. Alternatively, the radiant heat source can be flash lamps, where heating element comprises an energized gas such as xenon.

A dynamic heat sink 330 is located within the process area 318 at a position adjacent the substrate 321. As used herein, the terms "dynamic heat sink" and "semitransparent plate" are used interchangeably. A "dynamic heat sink" refers to an element placed within the process area adjacent to the substrate during processing such that the dynamic heat sink is heated less by direct source radiant energy than the substrate/wafer. In one or more embodiments, the dynamic heat sink may be used to cool the substrate by conductive coupling to the substrate. The term "dynamic" refers to the ability of the heat sink to be heated to different temperatures and/or different rates than the substrate during processing. The temperature and/or heating rate of the dynamic heat sink can be modified by incorporating different fluids (including vacuum) between the dynamic heat sink and the substrate, as described further below. In specific embodiments, the dynamic heat sink cools the substrate substantially only by conductive coupling to the substrate. As used in this specification and the appended claims, "substantially only by conductive coupling" means that conductive coupling accounts for greater than about 90% of the total heating of the dynamic heat sink.

In the embodiment shown in FIG. 4, the dynamic heat sink 330 is positioned adjacent the substrate 321 on the same side as the radiant heat source 310 and is located between the substrate 321 and the radiant heat source 310. In the embodiment shown in FIG. 5, the dynamic heat sink 330 is positioned adjacent the substrate 321 on the side opposite the radiant heat source 310. In detailed embodiments, the dynamic heat sink 330 is substantially transparent to radiation generated by the radiant heat source 310.

The chamber 300 includes a substrate support 325 located in the process area 318 and adapted to hold the substrate 321 during thermal processing. The substrate support 325 holds the substrate 321 so that at least one of the front side 322 and back side 324 of the substrate 321 faces the radiant heat source 310. In FIGS. 4 and 5, the substrate support 325 is shown as a small portion contacting the bottom edge of the back side 324 of the substrate 321. This is merely for illustrative purposes and should not be taken to imply a specific type of substrate support 325 or configuration. In detailed embodiments, the substrate support 325 may be an annular edge ring adapted to contact a portion of the edge of the substrate 321.

In a detailed embodiment, the dynamic heat sink 330 is supported by an independent heat sink support 326. The independent heat sink support 326 is shown as a small portion contacting the bottom edge of the dynamic heat sink 330. This is merely for illustrative purposes and should not be taken to imply a specific type of dynamic heat sink support 326. In detailed embodiments, the dynamic heat sink support 326 may be an annular edge ring adapted to contact a portion of the edge of the dynamic heat sink 330.

In some embodiments, the independent heat sink support 326 is operable during thermal processing to move the dynamic heat sink 330 so that there is a gap 335 between the dynamic heat sink 330 and the substrate 321. Embodiments of this type have the ability to adjust the size of the gap 335 during processing so that the gap 335 size can be varied. Thus, the heat sink 330 can be moveable with respect to the substrate 321. The dynamic heat sink 330 can be moved by any suitable means, for example, by magnetically linking the independent heat sink support 326 to magnets that bias the independent heat sink support to move up or down. In other embodiments, lift pins, which can be pneumatically or hydraulically actuated, can be positioned to lift and lower the dynamic heat sink 330 to vary the distance between the dynamic heat sink 330 and the substrate 321 during processing. In specific embodiments, the dynamic heat sink 330 is supported by an independent heat sink support 326, and the substrate support 325 and independent heat sink support 326 are separately moveable.

Figure 6:
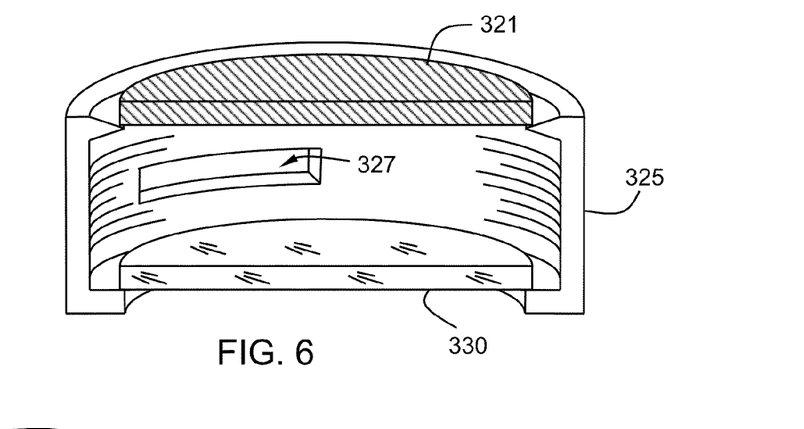
FIG. 6 illustrates a combination substrate and dynamic heat sink support according to one or more embodiments of the invention.

In a specific embodiment, the dynamic heat sink 330 is supported by the substrate support 325. FIG. 6 shows a cross-section of an example substrate support 325 capable of simultaneously holding both the substrate 321 and the dynamic heat sink 330. The substrate support 325 may include access ports 327 allowing access to the gap 335 between the substrate 321 and the dynamic heat sink 330. The number, shape and size of the access ports 327 can be determined based on need, and are not limited to the design shown.

The wafer to dynamic heat sink gap can be a varied from a relatively large gap to close to zero gap. In the practical case, however, the gap is should be slightly larger than zero due to roughness and planarity of the dynamic heat sink and/or the substrate. In one embodiment, the gap distance is directly proportional to the heat conduction between the substrate and the dynamic heat sink. Variation of the distance allows one to control the amount of heat transfer at any given time of the process. While the gap can be any suitable distance to effect cooling of the substrate, in a specific embodiment, the gap between the substrate and the dynamic heat sink is at least about 10 mm. In detailed embodiments, the gap 335 is up to about 5 mm wide. In other detailed embodiments, the gap 335 is up to about 3 mm, 2 mm, 1 mm or 0.5 mm wide. In detailed embodiments, the gap 335 is less than about 5 mm wide. In other detailed embodiments, the gap 335 is less than about 3 mm, 2 mm, 1 mm, 0.5 mm, 0.2 mm or 0.1 mm wide. In various detailed embodiments, the gap 335 is varied during processing in the range of about 0.05 mm to about 5 mm wide. In a specific embodiment, the gap 335 is less than about 0.1 mm wide.

The medium between the substrate and the dynamic heat sink can be varied, or exchanged from very low conductivity to high conductivity. In one or more embodiments, the use of different gases as the medium between the substrate and dynamic heat sink is contemplated. For example, oxygen or helium, which have different heat capacity and allow for different conductive coupling between the substrate and the dynamic heat sink can be used. In specific embodiments, the heat up rate is maximized by a large gap width and less conductive, lower heat capacity medium, and the cool down rate is maximized by a small gap and a highly conductive medium with high heat capacity. Thus, in some embodiments, the chamber 300 further comprises a conductive fluid source 370 in fluid communication with the gap 335 such that a conductive fluid can be flowed in the gap 335 at a variable rate or quantity. In detailed embodiments, the gap 335 can be filled with a conductive fluid or displace/mix with an existing fluid and be held substantially static. As used in this specification and the appended claims, "substantially static" means that the fluid is not actively flowed into the gap 335, but convective mixing and residual motion may occur. In detailed embodiments, the fluid is selected from the group consisting of nitrogen gas, oxygen gas, helium gas, argon gas, hydrogen gas and combinations thereof.

Figure 7:
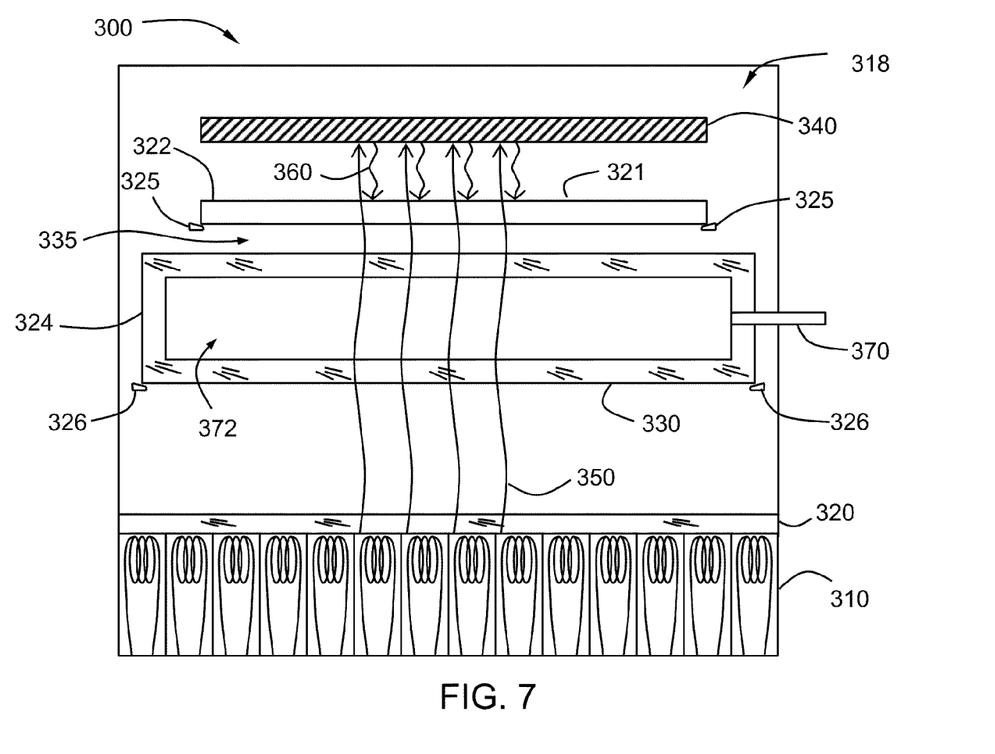
FIG. 7 illustrates a processing apparatus according to one or more embodiments of the invention.

In another variant, the dynamic heat sink 330 may comprise two transparent plates arranged in a substantially parallel relationship, an embodiment of which is shown in FIG. 7. The plates may be supported by internal, low thermal conductivity supporting structures (not shown). The plate spacing 372 of various embodiments is in the range of about 0.1 mm to about 5 mm. During heating of the substrate, a high vacuum could be established between the two transparent plates, and during cooling, a high conductivity fluid such has helium could be flowed between the plates. Although FIG. 7 shows a single conductive fluid source 370, specific embodiments incorporate more than one conductive fluid source 370. Additional fluid sources may better temperature uniformity during brief helium inlet times. In detailed embodiments, there is substantially no fluid flow during processing.

In one or more embodiments, the chamber 300 further comprises a reflector plate 340 to reflect light 350 from the radiant heat source 310. The reflector plate 340 may be positioned so that one of the front side 322 and the back side 324 of the substrate 321 faces the radiant heat source 310 and the other of the front side 322 and the back side 324 of the substrate 321 faces the reflector plate 340.

In specific embodiments, the dynamic heat sink 330 is made from a material selected from the group consisting of quartz, sapphire and transparent YAG.

When the radiant energy source is deactivated, the substrate 321 is at a higher temperature than the dynamic heat sink 330. Because the dynamic heat sink 330 is cooler than the substrate 321, it causes the temperature of the substrate 321 to decrease faster than if the dynamic heat sink 330 was not present in the chamber.

Without being bound by any particular theory of operation, in a specific embodiment using a dynamic heat sink 330 that is substantially transparent to light from the radiant heat source 310, the dynamic heat sink 330 will be heated substantially only by conductive coupling to the substrate 321. As conductive coupling is a less efficient means of heating the dynamic heat sink 330 than radiant heating, the dynamic heat sink 330 will have a lower temperature than the substrate 321. If the radiant heat source 310 is left on too long, the temperatures of the substrate 321 and the dynamic heat sink 330 will reach equilibrium at approximately the same temperature.

In one or more specific embodiments, the dynamic heat sink 330 is heated by a combination of radiant energy and conductive coupling to the substrate 321. The relative contribution of radiant energy and conductive coupling to the total heating of the dynamic heat sink 330 can be varied, so long as the temperature of the dynamic heat sink 330 remains lower than the temperature of the substrate 321. In detailed embodiments, the net heating is such that the dynamic heat sink 330 temperature is less than the substrate 321 temperature during heatup. Without being bound by any particular theory of operation, it is believed that the dynamic heat sink 330 absorbs less radiant energy than the substrate 321 on a thermal mass/area basis.

In detailed embodiments, the semitransparent plate 330 (also called a dynamic heat sink) is made from a material that has a heat absorption that is less than the heat absorption of the substrate 321 material. This helps to ensure that the temperature of the dynamic heat sink 330 is lower than that of the substrate 321 upon heating.

In some detailed embodiments, the gap distance between the semitransparent plate and the substrate is adjustable such that the heat absorption of the semitransparent plate 330 is dynamic. In a specific embodiment, the gap 335 distance is less than about 1 mm. In other detailed embodiments, the gap 335 distance is less than about 3 mm, 2 mm, 1 mm or 0.5 mm.

In detailed embodiments, the substrate 321 is silicon and the semitransparent plate 330 comprises quartz.

In some detailed embodiments, the chamber 300 further comprises a conductive fluid source 370 in fluid communication with the gap 335 such that the conductive fluid can be flowed in the gap 335 at a variable rate or quantity. As used in this specification and the appended claims, the term "conductive fluid" is used to mean any fluid capable of affecting the conductive coupling between the substrate 321 and the dynamic heat sink 330. This, therefore, includes fluids which increase or decrease the degree of conductive coupling.

In a specific embodiment, the dynamic heat sink 330 in maintained at a distance from the substrate 321 sufficient to significantly decrease the conductive coupling between the two. This would result in the dynamic heat sink 330 having a much lower temperature than the substrate 321. A fluid can then be flowed into the gap 335 between the substrate 321 and the dynamic heat sink 330 to increase the conductive coupling between the two. The result being that the substrate 321 will cool faster than without the conductive fluid because the temperature difference between the substrate 321 and the dynamic heat sink 330 will have a greater impact on the substrate 321.

In another specific embodiment, the dynamic heat sink 330 is maintained at a fixed distance to the substrate 321 with a conductive fluid in the gap 335 that decreases the conductive coupling between the two. After heating, the conductive fluid can be flushed with another fluid that increases the conductive coupling. This would result in the dynamic heat sink 330 having a lower temperature upon heating than it would without the conductive fluid interference and a greater impact on the substrate 321 after the conductive fluid is changed. In one or more detailed embodiments, the heat up can occur in a low pressure low thermal conductivity gas and the cool down in a higher pressure higher thermal conductivity gas. Without being bound by any particular theory of operation, it is believed that if the pressure ratio is high, there should be less spatial variation of the thermal conductivity during the gas composition change. (The pressure will equilibrate faster than the gas exchange/displacement can occur.)

Further embodiments of the invention are directed to methods of processing a substrate 321 having a front side 322 and a back side 324 in a processing chamber 300 comprising a radiant heat source 310. The method comprises supporting a substrate 321 within the processing chamber 300. A dynamic heat sink 330 is supported within the processing chamber 300, the dynamic heat sink 330 being substantially transparent to light emitted by the radiant heat source 310. The radiant heat source 310 is operable to heat the substrate 321 to a first temperature. The dynamic heat sink 330 is heated substantially only by conductive coupling to the substrate 321 to a second temperature. The second temperature being less than the first temperature. The radiant heat source 310 is then deactivated.

In detailed embodiments, the dynamic heat sink 330 is moved to a position closer to the substrate 321 upon deactivating the radiant heat source 310. By changing the size of the gap between the substrate 321 and the dynamic heat sink 330, the degree of conductive coupling can be modified. By decreasing the conductive coupling during heating, the temperature of the dynamic heat sink 330 will be lower than the substrate 230. Once the radiant heat source 310 is disengaged, the dynamic heat sink 330 can then be moved closer to the substrate 321 to increase the conductive coupling. This may result in the substrate 321 cooling at a faster rate than if the conductive coupling remained constant throughout the process.

In a very specific embodiment, the substrate 321 and dynamic heat sink 330 are heated with a gap 335 of about 1 mm and oxygen gas as the conductive fluid in the gap 335.

After heating, the gap 335 is reduced to about 0.5 mm and the conductive fluid is replaced with helium gas to increase the rate of cooling of the substrate 321.

In detailed embodiments, the methods further comprise adding a fluid to the gap 335 between the dynamic heat sink 330 and the substrate 321.

Additional embodiments of the invention are directed to methods of processing a substrate 321 comprising heating a substrate 321 to a first temperature using radiant energy. The radiant energy can be emitted from a radiant heat source 310. The substrate 321 is heated to a first temperature using radiant energy. The dynamic heat sink 330 is heated substantially only by conductive coupling with the substrate 321 to a second temperature, the second temperature being less than the first temperature. The substrate 321 is cooled using conductive coupling with the dynamic heat sink 330.

According to one or more embodiments of the invention described herein, the cool down rate would be significantly increased In specific embodiments, such rapid cool down rates can be provided where a gap between the dynamic heat sink and the substrate is less than about 0.1 mm, allowing a cool down rate of faster than 200° K/second.

Thus, according to one or more embodiments, a dynamic heat sink, also called a semitransparent modifier plate (SMP) is provided that is made from a material that absorbs radiation from the heating lamps less than the substrate to be processed in the chamber. For silicon substrates, quartz can be used for the dynamic heat sink. In chambers that use tungsten halogen lamps, quartz absorbs less of the shorter wavelength part of the tungsten halogen lamp spectrum and stays cooler than the wafer during the heat-up and during the constant temperature part of the recipe. The gap between the dynamic heat sink and the substrate allows the temperature of the substrate to stay higher than the dynamic heat sink.

Embodiments of the invention are useful for increasing the cool down rate of a substrate. In a detailed embodiment, the cool down rate is in the range of about 70 to about 150 K/s. In other specific embodiments, the average cool down rate is greater than about 70 K/s, 80 K/s, 90 K/s, 100 K/s, 110 K/s, 120 K/s, 130 K/s or 140 K/s.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. For example, while the present invention has been described with respect to a particular type of heating lamp, other variants are possible. Embodiments of the invention can be used in any field where a substrate is heated by UV to IR radiation to increase to the cooling rate of that substrate. Thus, it is intended that the present invention include modifications and variations that are within the scope of the appended claims and their equivalents.

What is claimed is:

1. An apparatus for processing a substrate having a front side and a back side, the apparatus comprising:
    a process area within a chamber defined on one side by a window adjacent a radiant heat source located outside the process area;
    a dynamic heat sink positioned in the process area and substantially transparent to light from the radiant heat source; and
    a substrate support in the process area to hold the substrate adjacent the dynamic heat sink during thermal processing in a position such that at least one of the front side and back side of the substrate faces the radiant heat source and so that the dynamic heat sink couples to the substrate to absorb heat from the substrate.

2. The apparatus of claim 1, wherein during thermal processing of a substrate there is a gap between the dynamic heat sink and the substrate.

3. The apparatus of claim 1, wherein during thermal processing the dynamic heat sink is positioned adjacent the substrate on the side opposite the radiant heat source.

4. The apparatus of claim 1, wherein during thermal processing the dynamic heat sink is positioned adjacent the substrate on the same side as the radiant heat source between the radiant heat source and the substrate.

5. The apparatus of claim 1, wherein the dynamic heat sink is supported by the substrate support.

6. The apparatus of claim 1, wherein the dynamic heat sink is supported by an independent heat sink support and the independent heat sink support and substrate support are separately moveable.

7. The apparatus of claim 6, wherein during thermal processing of a substrate, the independent heat sink support is operable to move the dynamic heat sink so that there is a gap that can be varied between the dynamic heat sink and the substrate.

8. The apparatus of claim 2, wherein the gap is up to about 1 mm wide.

9. The apparatus of claim 2, further comprising a conductive fluid source in fluid communication with the gap such that the gap can be filled with a conductive fluid or displace/mix with an existing fluid and be held substantially static.

10. The apparatus of claim 9, wherein the fluid is selected from the group consisting of nitrogen gas, oxygen gas, helium gas, argon gas, hydrogen gas and combinations thereof.

11. The apparatus of claim 1, further comprising a reflector plate to reflect light from the radiant heat source, the reflector plate being positioned so that one of the front side and the back side face the radiant heat source and the other of the front side and the back side face the reflector plate.

12. The apparatus of claim 1, wherein the dynamic heat sink is selected from the group consisting of quartz, sapphire and transparent YAG.

* * * * *